(12) United States Patent
Bhandari et al.

(10) Patent No.: US 6,404,578 B1
(45) Date of Patent: Jun. 11, 2002

(54) CIRCUIT FOR REDUCTION AND OPTIMIZATION OF WRITE-TO-READ SETTLING TIMES IN MAGNETIC MEDIUM STORAGE DEVICES

(75) Inventors: Sanjay M. Bhandari, Santa Clara; David Allouche, Belmont, both of CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/407,776

(22) Filed: Sep. 28, 1999

(51) Int. Cl.[7] ............................................... G11B 15/12
(52) U.S. Cl. .............................. 360/61; 360/46; 360/65
(58) Field of Search ............................. 360/46, 66, 67, 360/61, 65, 68

(56) References Cited

U.S. PATENT DOCUMENTS

| | | | |
|---|---|---|---|
| 5,220,220 A | | 6/1993 | Tse et al. ..................... 307/521 |
| 5,270,875 A | * | 12/1993 | Shah et al. .................... 360/46 |
| 5,559,646 A | | 9/1996 | Voorman et al. ............... 360/67 |
| 5,619,386 A | | 4/1997 | Voorman et al. ............... 360/67 |
| 5,648,738 A | * | 7/1997 | Welland et al. ............. 327/307 |
| 6,252,459 B1 | * | 6/2001 | Franck ....................... 330/294 |

FOREIGN PATENT DOCUMENTS

| | | | |
|---|---|---|---|
| EP | 57002137 A | 1/1982 | ............ H04B/3/06 |
| EP | 0720152 A2 | 7/1996 | |
| EP | 09148886 A | 6/1997 | ............ H03H/1/02 |
| JP | 5166111 | 7/1993 | |

* cited by examiner

Primary Examiner—Regina N. Holder

(57) ABSTRACT

A preamplifier integrated circuit for a magnetic storage device includes read channel and a write channel. The read channel includes a filter in a forward signal path which has a low corner frequency (LCF) which varies in a time dependent manner related to the duration of a write-to-read disturbance induced by a transition from a write mode to a read mode. The LCF of the filter moves from a relatively high initial frequency to a lower steady state frequency to effectively reduce the settling time of the write-to-read disturbance without causing read errors which may arise from overfiltering in the steady state. Favorably, the filter in the forward signal path is formed by a unity gain differential emitter-follower in the forward path and a low pass filter (LPF) in a feedback path around the differential emitter-follower, the pole of the LPF being moved to achieved the movement of the LCF in the forward path. In the steady-state read mode, the filter arrangement also significant reduces DC offset in the read channel.

24 Claims, 11 Drawing Sheets

CIRCUIT FOR REDUCTION AND OPTIMIZATION OF WRITE-TO-READ SETTLING TIMES IN MAGNETIC MEDIUM STORAGE DEVICES

BACKGROUND OF THE INVENTION

1. Field of the Invention

The invention relates generally to devices which read information from a magnetic medium. More particularly, the invention concerns a control circuit to optimize write-to-read settling times of such a device.

2. Description of the Prior Art

Magnetic recording devices are used to write information to a magnetic medium either in analog or digital form. The magnetic medium is typically a tape, such as used in the well known compact cassette or known high density drives for computers which are used for backup purposes. Another common form is a disc, such as a floppy disc or a hard disc for storing programs and data in a computer.

The read channel for a magnetic recording device includes a sensor in the form of a magneto-resistive head in close proximity with the magnetic medium. When the magnetic material is moved relative to the sensor, a flux is induced in the sensor in dependence of the local orientation of the magnetic material, thereby generating an information signal which can be amplified and then decoded.

When information is written in digital form, such as for computer data storage or digital recording of music, a current is generated by a write channel and passed through a thin film head in one direction to write a binary "1" and in the opposite direction to write a "1". When the medium is read by the sensor, or read head, the portions recorded with a binary "1" will induce a current in the head in the one direction and portions recorded with a binary "1" will induce a current in the opposite direction, which is then decoded by a bit detector.

Hard disk drives typically include multiple magnetic discs, or platters, each side of which are used for reading and writing information. The read heads and write heads are mounted on arms positioned at each side of the disk, and in modern systems, servo patterns are embedded in radial patterns on the disk. Reading and writing are interchanged in conformance with the servo patterns.

Write-to-read settling time is an important specification because it impacts directly with drive capacity. Write-to-read settling time is defined to be the time required for the read channel to settle and be able to read the next servo field after the write channel has stopped writing. The gap on the magnetic disk between the end of the write sector and the start of the servo field is wasted area and hence should be minimized.

The disturbance to the read channel during write-to-read transition comes mainly from three sources. The first source is a flexible cable which is conventionally used to electrically couple the integrated circuit which embodies the read and write channel circuitry to the write heads and read sensors. This cable has multiple conductors in close proximity, which is a source of interference. The circuitry for the write channel and the read channel are typically embodied on a single integrated circuit, referred to in the art as a "preamplifier IC". The preamplifier IC will have several read and write channels, grouped in read/write pairs for each read/write head combination in the device. The close physical proximity of the read channel circuitry and the write channel circuitry on the integrated circuit is a source of undesired capacitive coupling between the write and read channels. A third source of interference is from the connection pins, bond wires and bond pads on the integrated circuit, which may also be a source of unwanted coupling. The disturbances from each of these sources needs to be suppressed from propagating to the output of the read channel, so as to avoid errors in decoding the information read from the disc. On the other hand, excess suppression will also interfere with the proper reading of actual data.

The exact duration and nature of write-to-read disturbances are somewhat unpredictable. It depends on the assembly of the heads, sensors and flexible cable, as well as other sources as described above, and hence varies between models of hard disk drives assembled by a manufacturer of such devices. When designing a preamplifier IC, the designer must model the interference sources, based on design data provided by the disk drive manufacturer as well as past experience (if any) with other models of that manufacturer, to design a suitable filter for interference suppression for the read channel. After fabricating the preamplifier IC, the IC is tested in the intended hard disk of the manufacturer. If there is too little suppression or too much suppression, unacceptable read errors will occur and the designer will have to re-design the filters in the IC, necessitating changes to the mask set for the IC as well as re-fabrication of the preamplifier IC with the revised filters. Such an iterative process undesirably lengthens the design cycle, increasing costs for both the IC manufacturer and the manufacturer of the hard disk drive or other magnetic storage device.

Even after arriving at a suitable design for the preamplifier IC, the hard disk drive manufacturer still faces problems with chip-to-chip variations in the pre-amplifier ICs, as well as drive-to-drive variations in the assembly of the read sensors, write heads, flex cables and their interconnection with the preamplifier IC. While all elements may be "within spec", the combination of several elements near their outer tolerance limits will often yield a hard disk drive with a read error rate outside of acceptable limits.

In the present state of the art, suitable tools are not available to the IC manufacturer to avoid the above-mentioned iterations in the design cycle nor for the drive manufacturer to easily fix read error problems arising from normal chip-to-chip variations and variations in the head/sensor/cable interconnect.

SUMMARY OF THE INVENTION

Accordingly, there is a need for a device which enables reduction of write-to-read settling time. There is also a need for a way to allow users to program the duration and intensity of write-to-read correction so that it can be optimized easily without the need to reiterate the design cycle.

Generally speaking, according to one aspect of the invention, a magnetic information storage apparatus includes a write channel for writing information to a magnetic medium and a read channel for reading information from the magnetic medium. The read channel includes a sensor which generates an information signal in response to information stored on the magnetic medium. A signal path is coupled to the sensor and amplifies the information to provide an amplified information signal. When transitioning from a write mode in which the write channel is active to a read mode in which the read channel is active, the transition induces a write-to-read disturbance in the read channel. The signal path includes a filter having a zero which varies over frequency in a time-dependent manner related to the amplitude of the write-to-read disturbance.

By varying the low corner frequency ("LCF") of the filter in a time-dependent manner, the attenuation of the filter can be set to generally match the amplitude of any write-to-read disturbances. Generally, this permits high filtering when the amplitude of the disturbance is expected to be high and low filtering when the amplitude of the disturbance is expected to be low. By not over filtering or under filtering, as is typically the case with prior art systems having a fixed attenuation filter at the front end of the read channel, reduced read error rates and reduced transition times are possible relative to the known systems.

According to a second aspect of the invention, the forward signal path has at least one gain stage and the time-dependent filter in the forward signal path is provided by a feedback path having a low pass filter with a pole which varies in a time-dependent manner and which couples the output of the at least one gain stage to the input of the at least one gain stage. Varying the pole of the low pass filter in the feedback path varies the zero in the forward path, and consequently the low corner frequency of the read channel. Favorably, the at least one gain stage is an emitter-follower, which has the benefit of wide bandwidth, unity gain, and common use in pre-amplifier IC's as a buffer stage. The first two benefits simplify the feedback system by imposing few design constraints, while the latter benefit means the feedback system can be placed anywhere in the read channel such a buffer already exists.

According to a third aspect of the invention, the disturbance in the signal path caused by the write-to-read transition was found to have a relatively high initial peak amplitude followed by a long tail of decaying amplitude. To effectively filter this type of disturbance, the zero in the forward path is set to vary from a first relatively high frequency to a second relatively low frequency by varying the pole of the low pass filter from a third, relatively high frequency to a fourth relatively low frequency.

According to a fourth aspect of the invention, the low pass filter includes a variable capacitance, the variation of the capacitance moving the pole of the low pass filter. Favorably, the variable capacitance includes a plurality of switched capacitors. An equalization circuit is provided to equalize the voltage on each contact node of the capacitors to avoid transients when the capacitors are switched into the circuit.

According to a fifth aspect of the invention, the apparatus includes a programmable controller programmable by a user, such as a hard disk drive manufacturer, via an interface (such as a serial interface) to control the time-dependent characteristics of the user interface.

In a sixth aspect of the invention, the forward signal path of the read channel includes a plurality of gain stages. The location of the time-dependent zero is in the "back end" of the signal path, i.e. closer to the output of the signal path than the first gain stage. This helps in reducing DC offset of the read channel. Offset is the differential DC component at the output when the differential DC component at the input is zero, and is caused by mismatches in components, amplifier differential mismatches, and parasitic resistances in wiring.

Another aspect of the invention concerns a preamplifier integrated circuit which includes a read channel with one or more of the above mentioned features.

Yet another aspect of the invention is a method for filtering recurring transient disturbances in a signal path, the disturbances having an initiation point and decay. The method including filtering the signal with a filter having controllable attenuation and recurrently (i) at the initiation point of the transient disturbance, setting the attenuation of the filter at a first level to substantially filter the disturbance, and (ii) reducing the attenuation of the filter in a time dependent manner related to the decay of the disturbance from a first level to a second, lower level. According to another aspect of this method, the disturbance is triggered by an event in a device, said method further comprising sensing the event to set the filter at the first attenuation level. In another aspect of the invention, the attenuation level is changed from the first level to the second, lower level by moving a zero in the signal path from a first frequency to a second lower frequency.

These and other object, features and advantages of the invention will become apparent with reference to the following detailed description and the drawings.

DETAILED DESCRIPTION OF THE PREFERRED EMBODIMENTS

I. Reducing Write-to-Read Settling Time by Using Time-Dependent Filter

Figure 1:
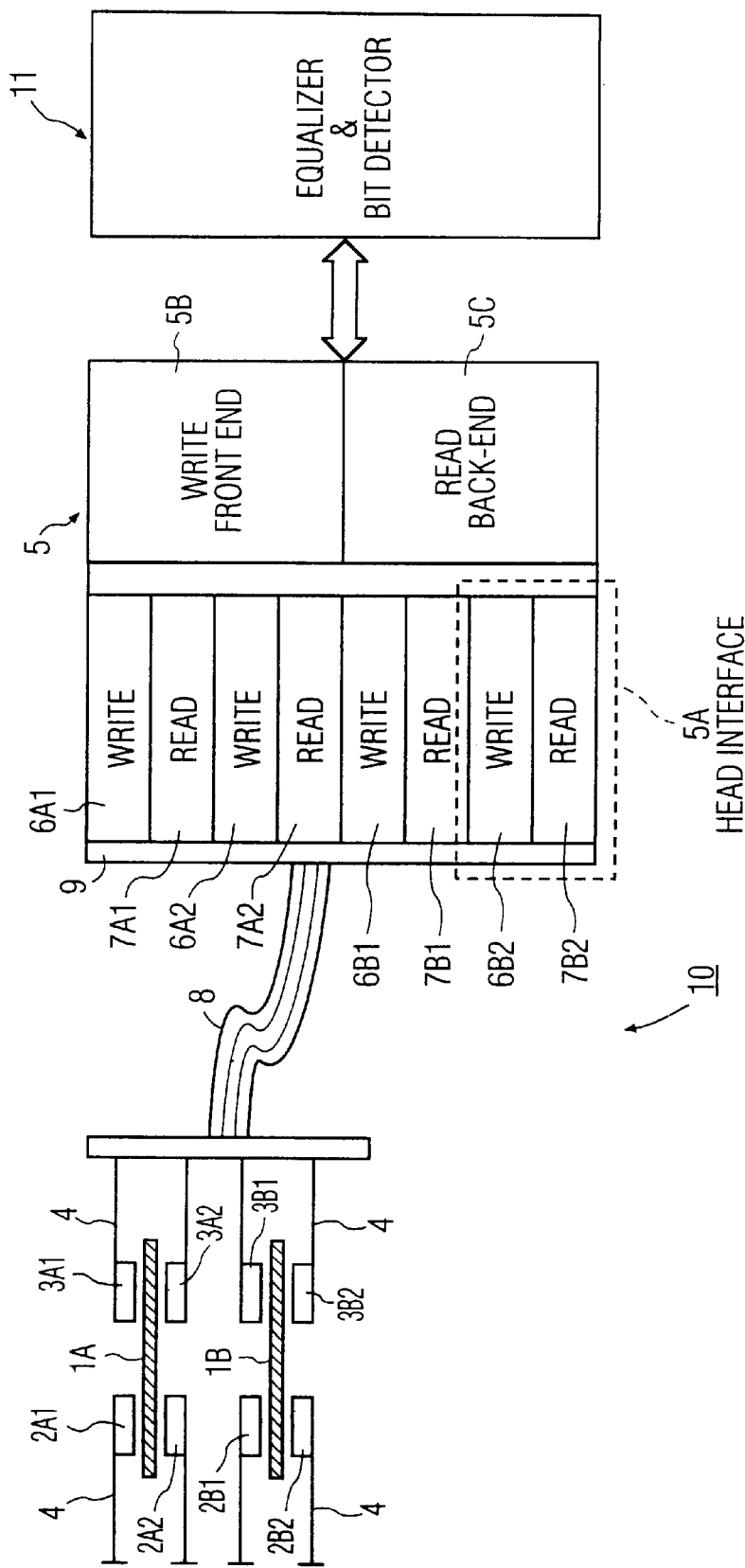
FIG. 1 is a diagram of a magnetic recording apparatus and preamplifier IC according to the invention.

FIG. 1 illustrates a block diagram of one type of magnetic storage device 10 according to the invention, in this case a hard disk drive for mass storage of data. The device 10 includes a plurality of magnetic disks (of which only two (1A, 1B) are shown for purposes of clarity), and a plurality of pairs of write heads 2A1, 2A2; 2B1, 2B2 and read sensors 3A1, 3A2; 3B1, 3B2 mounted on respective servo controlled arms 4 which position the heads and sensors radially relative to corresponding sides of the spinning disks 1. The servo control of the arms and of the speed of the spinning disks is well known in the art and not pertinent to the present invention, but will be understood to include various servo motors, sensors and control circuits therefor.

A preamplifier IC 5 includes a plurality of write channels 6A1, 6A2; 6B1, 6B2 and a plurality of read channels 7A1, 7A2; 7B1; 7B2, each write channel driving a respective write head to write information to a respective side of a disk 1A, 1B and each read channel driving a read sensor to read information from a respective side of a disk 1A, 1B. These write and read channels, grouped conventionally in a pair wise configuration, form a part-per-head (or head interface) portion 5A of the preamplifier IC. The IC 5 is coupled to the read sensors and write heads via a flexible cable interconnect 8, which electrically connects the write heads and read sensors to the read and write channels through connection pins/bumps 9 of the preamplifier IC 5. The IC 5 further includes a back-end read portion 5C and a front-end write portion 5B. The front-end read portions contain a first gain stage for each read sensor, while the back-end read stage contains a plurality of gain stages and control circuitry common to all of the front-end read channels and is selectively coupled to a front-end read channel 7A1, 7A2, 7B1, 7B2 depending on which read sensor is selected to read information from a disk 1A, 1B.

The preamplifier IC 5 in a hard disk drive is coupled to a further IC 11 which, for reading information, includes at least an equalizer and a bit detector.

Figure 2A:
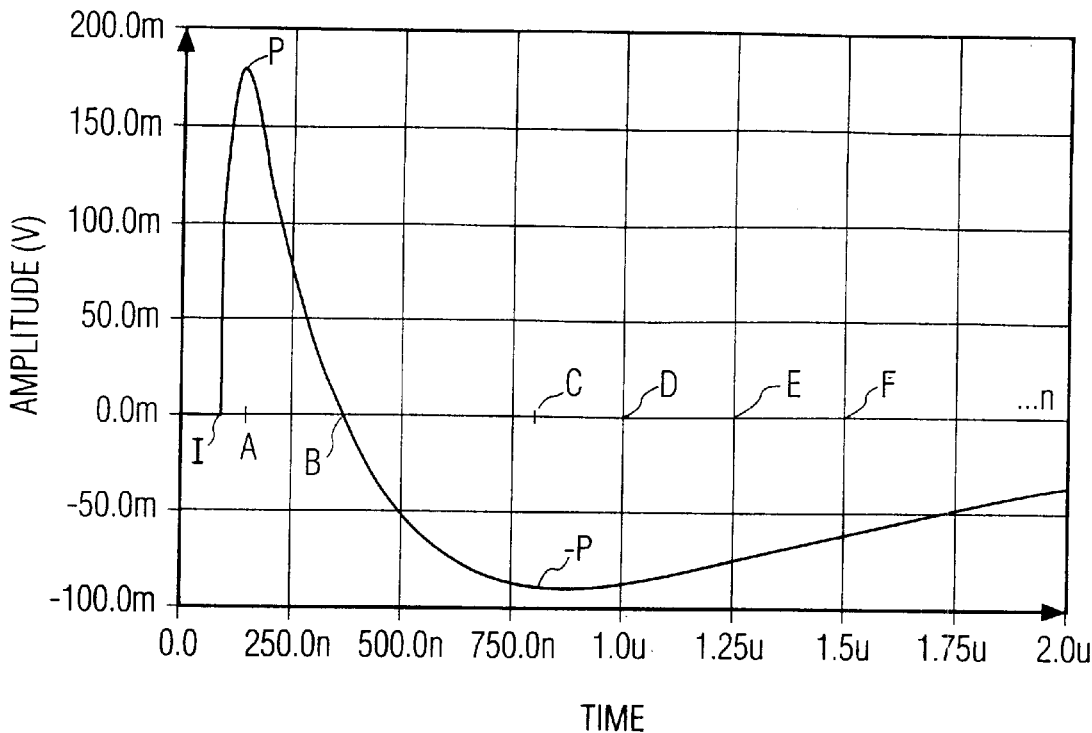
FIG. 2A is a graph illustrating a transient disturbance arising at the front end of a read channel as a result of a transition from a write-to-read state of the apparatus of FIG. 1.

As previously mentioned, when the disk drive apparatus transitions from writing information to a disk to reading information from a disk, this write-to-read transition induces spurious disturbances into the read channels due to the interconnect 8, the connections pins and bond wires 9, and the close physical proximity of read and write channel front-end circuitry on the IC 5. FIG. 2A is a graph which illustrates a voltage waveform of a typical disturbance caused by a write-to-read transition. At time "I", the write-to-read transition occurs and the disturbance rapidly peaks to a peak P during time period A. The disturbance rapidly decays through zero volts at time B, to a negative peak ("−P") at a time C. Over a period of time (e.g. periods C–F, . . . n), on the order of micro-seconds, the disturbance has a long tail and decays from the negative peak towards zero volts. The waveform of FIG. 2A is for illustration purposes only, and each combination of read sensor, write head, flexible interconnect and preamplifier IC will generate a proportionally different waveform. However, the present inventors have found that the waveforms for write-to-read disturbances in a high speed hard disk drive typically have a high initial peak, a negative peak and decay over time (e.g. periods A–F, . . . n) with a long tail, and are measurable and characterizable through component testing.

Figure 3A:
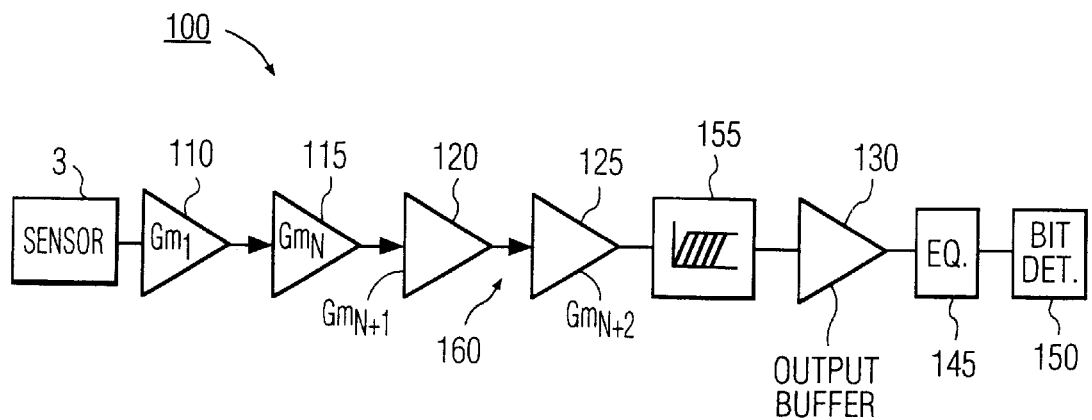
FIG. 3A is a simplified block diagram of a preamplifier integrated circuit according to the invention with a filter as in FIG. 2B in the forward signal path.

FIG. 3A is a block diagram of a read channel 100 according to the invention having a plurality of gain stages, for example 3–5 stages, to amplify the signal from a read sensor 3 so that it can be decoded by a decoding circuit within the read/write channel IC. An MR read sensor 3 is coupled to an output buffer 130 via a plurality of gain stages 110, 115, 120 and 125 ($Gm_I$, $Gm_n$, $Gm_{n+1}$, $Gm_{n+2}$) in the forward signal path 160 of the read channel 100. Together, the gain stages 110, 115, 120 and 125 provide an amplified information signal via output buffer 130 to an equalizer 145 and a bit detector 150, which together form part of a decoder circuit, and which converts the analog information signal into a train of successive digital bits. The train of successive digital bits is then decoded according to an algorithm, depending on how the information was encoded when written to the magnetic medium.

Figure 2B:
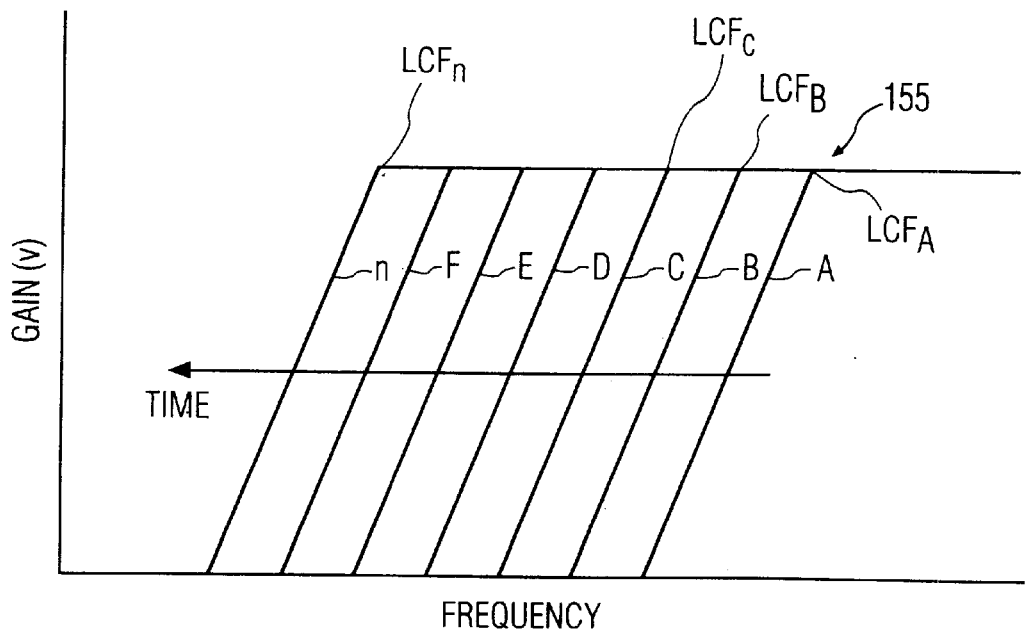
FIG. 2B is a graph of the gain of a filter having a time-dependent frequency characteristic.

In order to suppress transients introduced at the front-end of the read channel (i.e. stage 110) so that they do not reach the output of buffer 130, a filter 155 having a time-dependent gain characteristic is introduced in the forward signal path 60 of read channel 100. FIG. 2B illustrates the function of the filter 155. At an initial time period A in FIG. 2A corresponding to the peak period of the write-to-read transition, the filter has a relatively high $LCF_A$ (low gain) exemplified by the line "A". With increasing time, the LCF of the filter 155 is decreased in a fashion generally corresponding to the decay characteristic of the write-to-read disturbance, as illustrated by the time-wise shift (right-to-left in FIG. 2B) of the LCF of filter 155. Thus, at a time C in which the amplitude (frequency) of the disturbance is generally expected to be less than at a time A as illustrated in FIG. 2A, the time-dependent filter will have a correspondingly increased gain (reduced attenuation) at a given frequency. At a time "n" when the amplitude (frequency) of the disturbance is minimal, the filter 155 will have an LCF ($LCF_n$) and a gain "n" selected to not adversely effect the proper reading of data from the magnetic medium by the read sensor. The time starting with time "n" and thereafter is considered the "settled" state of the read channel when in the READ mode. The number of steps in the gain of the filter is for illustration purposes only, and may vary according to the needs of the application.

The gain stage 110 is in the front-end portion of IC 5, and one such gain stage 110 is present for each read channel. The gain stages 115, 120, 125, filter 155 and output buffer 130 are in the back-end circuitry of IC 5 and are common to all of the read channels. The equalizer 145 and bit detector 150 are conventionally on a separate IC 11.

Favorably, the zero is introduced in the "back-end" circuits of the read channel to more effectively reduce offsets. By "back-end" circuits is meant the gain stages closer to the buffer 130 than the initial gain stage 110. By placing the zero close to the output, there are no or only few subsequent stages to introduce offset, and conversely the zero reduces the offset of all the prior circuitry. In FIG. 3A, the filter is shown connected to output buffer 130.

As used herein, a "pole" is defined as the value of the complex variable $s=j\bullet=j2\pi f$ for which the transfer function A(s)=(infinity). A "zero" is defined as the value of s, where A(s)=0. Alternatively, as the context requires, the pole or zero is also referred to in terms of the frequency at which the transfer function is infinity or zero, respectively.

Figure 3B:
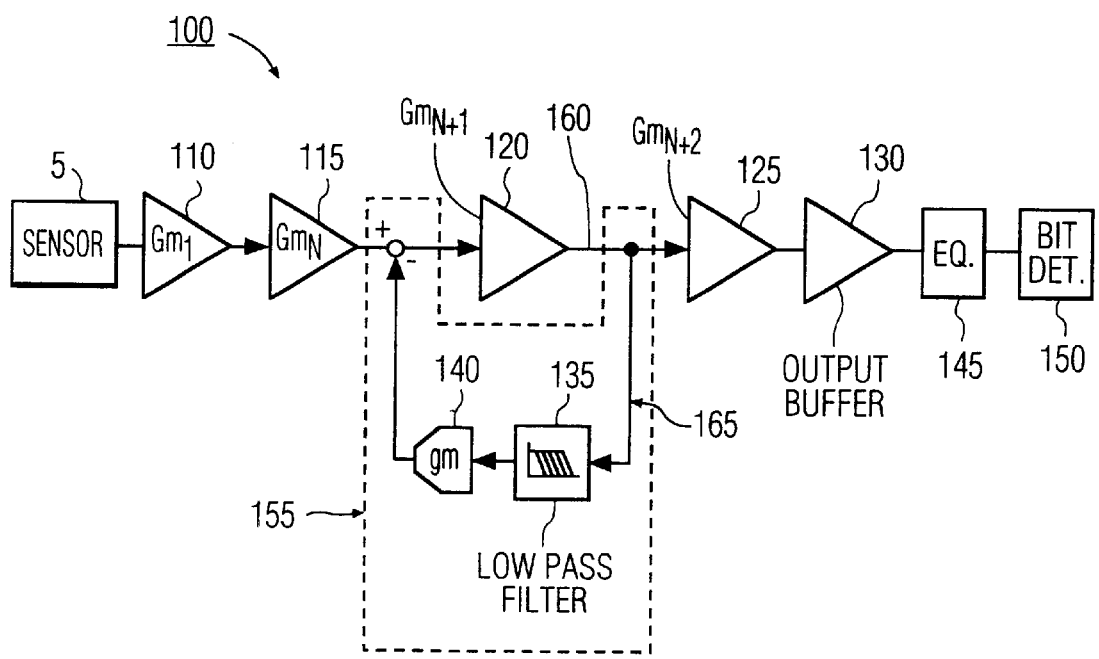
FIG. 3B is a simplified block diagram of a preamplifier integrated circuit in which the filter in the forward is embodied by a low pass filter in a feedback path having a time-dependent low corner frequency.

In a favorable embodiment (FIG. 3B), the filter 155 in the forward path is embodied by a low pass filter ("LPF") 135 in a feedback path 165 around a unity gain stage 120 in the forward path, the unity gain stage being implemented as an emitter-follower. The LPF 135 has a single (dominant) pole which can be varied from a fairly high frequency F1 to a lower frequency F2. This circuit, when in closed loop configuration, introduces a zero in the forward path. The location of this zero is varied from a high frequency $F_A$ to a low frequency $F_n$ as a result of varying the frequency of the pole in the feedback path from a high frequency F1 to the lower frequency F2. Varying the location of the pole of LPF 155 varies the LCF of the zero created thereby in the forward path 160, in the manner illustrated in FIG. 2B.

Explained in a different way, as shown in FIG. 2A, write-to-read transients are at a lower frequency than the signal frequency being read. In a time domain, the first peak portion (from point I to B) is at a frequency higher than the tail portion starting from point B to point n. This information about the nature of write-to-read disturbance frequencies is used to vary the LCF of the signal path in the present invention. For the time period during the peak portion,. the LCF should be higher than the frequency of pulse 1-P-B. After point B, to suppress the tail portion, the LCF can be smaller.

After a READ signal is switched ON to activate the read channel 100, for an initial small duration of time (of the order of 100 ns) when the transients from the read front-end are very large (e.g. time period A in FIG. 2A), the effective zero in the forward path is kept at a high frequency $F_A$. This filters away most of the write-to-read disturbances from reaching the output buffer 130, since the high frequency $F_A$ is higher than the frequencies of the write-to read disturbances, so maximum attenuation of the initial peal P (FIG. 2A) is achieved. After the initial duration A, the effective LCF in the forward path is moved through lower frequencies $F_B$, $F_C$, $F_D$ generally corresponding to the times B, C, D in FIG. 2A. Ultimately, the LCF reaches frequency $F_n$, where it is kept while the read channel is in the READ mode. This transition from $F_A$ through $F_n$ corrects the long tail of the write-to-read disturbance. Thus, the LCF of the effective filter 155 in the forward path is moved in such a manner that the there is maximum attenuation when the magnitude and frequency of the disturbance is high and lower attenuation when the amplitude and frequency of the disturbance is low. The end point of the LCF is such that it doesn't interfere with normal reading of data; i.e. the frequency of the LCF is much lower than the data frequency.

This will also simultaneously greatly reduce the offset of the entire read channel. Since the gain of stage 120 is unity, the reduction in offset is roughly proportional to the inverse of the gain of the feedback path 165. More precisely, the transfer function is equal to $(A_{120}/(1+(A_{120})(A_{165})))$, where $A_{120}$ is the gain of stage 120 (unity) and $A_{165}$ is the combined gain of the LPF 135 and of the Gm stage 140. In the present embodiment, the combined gain of stages 135 and 140 is about 8 at $LCF_n$, so the offset is reduced by a factor of 9.

The output of the LPF 135 is a voltage signal. A differentiator $Gm_f$ feedback stage 140 is included in the feedback path 165 to convert the voltage output of LPF 135 to a current for feeding back to the forward path at the output of the prior gain stage (in this case stage 115). Here, the feedback loop 165 is shown around the gain stage 120 instead of around the last gain stage 125.

Figure 4A:
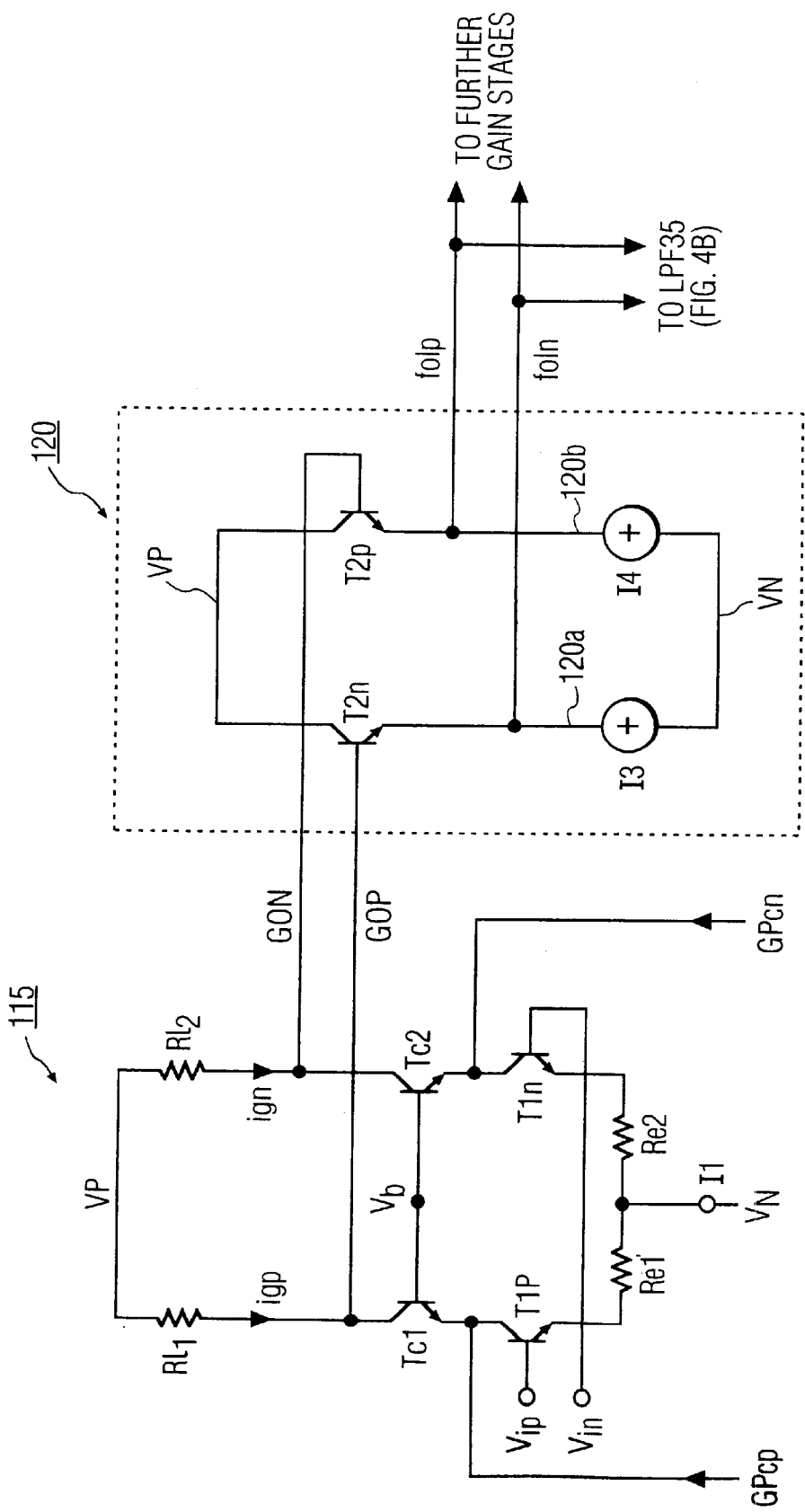
FIG. 4A is a circuit diagram showing exemplary circuits for the gain stages 115 and 120 of FIG. 3B.

FIG. 4a shows a circuit diagram of the gain stage 115 and the unity gain stage 120, which operates between an upper voltage supply rail VP and a lower voltage supply rail VN. The gain stage 115 includes cascode transistors Tc1, Tc2 coupled between load resistors RL1, RL2 and transconductance transistors T1n, T1p, respectively. The gain of this stage is equal to the ratio Rl1/Re1 (Rl1=Rl2; Re1=Re2). The output signal currents from the Gm stage 140 are fed back to below the cascode transistors Tc1, Tc2 so that the Gm stage 140 does not capacitively load the forward path signal path. Since stage 115 is a transconductance stage (without considering load resistors Rl1/Rl2), the input signal voltage Vip, Vin from the prior gain stage(s), applied at the bases of the transistors T1n, T1p are converted to currents igp, ign by these devices. The currents Gpcp, Gpcn from the Gm stage 140 are subtracted therefrom, and applied across the load resistors RL1, RL2 to provide signal voltages gop, gon for the stage 120.

Circuit branch 120a of stage 120 includes a first bipolar transistor T2n and a current source I3 biasing the emitter of the transistor T2n, and a circuit branch 120b with a current source I4 biasing the emitter of a second bipolar transistor T2n. The differential voltages gop and gon are applied to the bases of the transistors T2p, T2n. The outputs are differential voltages folp, foln which are fed to the LPF 135, as well as to the the next gain stage 125. Since the stage 120 is an emitter-follower and functions as a unity gain buffer, the differential output voltages are approximately of the same magnitude as the differential input voltages for this stage.

Figure 4B:
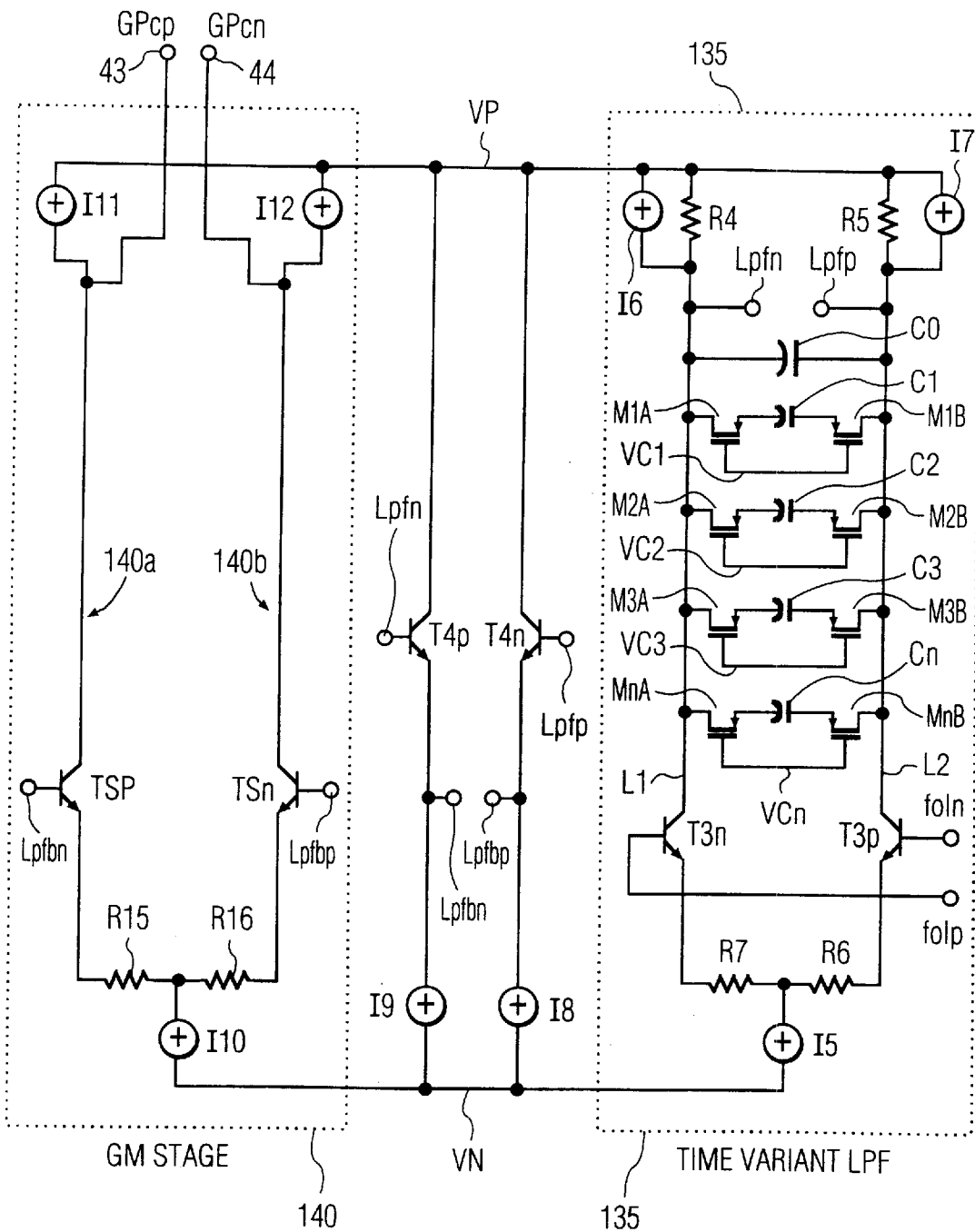
FIG. 4B is a circuit diagram showing exemplary circuits for the LPF 135 and differential $Gm_f$ 140 stages of FIG. 3B.

FIG. 4b shows the circuit diagram for the time variant LPF 135 and the gm stage 140. The LPF (also referred to as an integrator) includes a number of MOS switches and capacitors to vary the location of the pole of the LPF 135. The inputs to the LPF are voltage signals foln, folp, which are the differential outputs from the stage $(Gm_{n+1})$ 120. The signals foln, folp are coupled to the bases of bipolar transistors T3p, T3n. The emitter of each of the transistors T3p, T3n is coupled to a current source I5 via respective resistors R6, R7, the output of current source I5 being coupled to a lower voltage suppler rail VN. The collector of the transistor T3n is coupled via line L1 to the output of a current source I6 which is coupled in parallel with a load resistance R4. Similarly, the collector of the transistor T3p is coupled via line L2 to a current source I7, also in parallel with a small load resistance R5 (R4=R5=RL). The purpose of the current sources I6, I7 is to effectively choose the operating point of nodes Ipfn, Ipfp (otherwise it would be (I5/2*RL). Coupled between the lines L1 and L2 are a plurality of capacitors C0, C1, C2, C3, and Cn with capacitor C0 being fixed and the remaining capacitances being controllable. The capacitors C1, C2, C3, and Cn are coupled, respectively, to the lines L1 and L2 via MOS devices M1A, M1B; M2A, M2B; M3A, M3B and MnA, MnB. The gates of the devices M1A, M1B receive a control voltage V1, the gates of the devices M2A, M2B receive a control voltage V2, the gates of the devices M3A, M3B receive a control voltage V3, and, likewise, the gates of the devices MnA, MnB receive a control voltage Vn. The control voltages are provided to selectively couple the capacitors C1–Cn between lines L1 and L2 to vary the location of the pole of LPF 135. The outputs of the LPF 135 are differential voltages Lpfn, Lpfp.

These differential outputs are provided to a further emitter-follower buffer stage including current sources I8, I9 which bias respective bipolar transistors T4p, T4n. The differential outputs of this stage are signal voltages Lpfbn, Lpfbp.

The feedback gm stage 140 includes a first branch 140a, and a second branch 140b. The first branch 140a includes a bipolar transistor T5p having a collector, a base coupled to receive the first differential input voltage Ipfbn, and an emitter biased by a current source I10. Similarly, the second branch includes bipolar transistor T5n having a collector, a base coupled to receive the differential input voltage Ipfbp and an emitter biased by the current source I10. The emitters of the transistors T5p, T5n are coupled to the current source I10 via respective resistors R15, R16. Additionally, a current sources I11 and a current source I12 are coupled, respectively, in the branches 140a, 140b between upper supply rail VP and the collectors of the transistor T2n, T2p.

The outputs of the gm stage 140 are the currents Gpcp and Gpcn provided at outputs 43, 44, which are coupled to the prior amplifier stage 115 (Gm$_n$) in the forward signal path (as shown in FIG. 4A). The current source I10 provide a bias current to the emitters of the transistors T5n, T5p. Being a transconductance stage, the transistors T5n, T5p convert the differential small signal voltage Lpfbn, Lpfbp, into currents Gfcp, Gfcn which are proportional to the signal voltages Lpfbn, Lpfbp. The current sources I11, I12 replace the current drawn by the collectors of the transistors T5n, T5p so that the DC current at the outputs Gfcp, Gfcn is substantially zero, and therefor does not load and effect the operation of the prior gain stage 115. Ideally, currents I11=I12= (I10/2) so that during operation of the read channel no DC current flows through the load resistor RL of the forward signal path.

Figure 5:
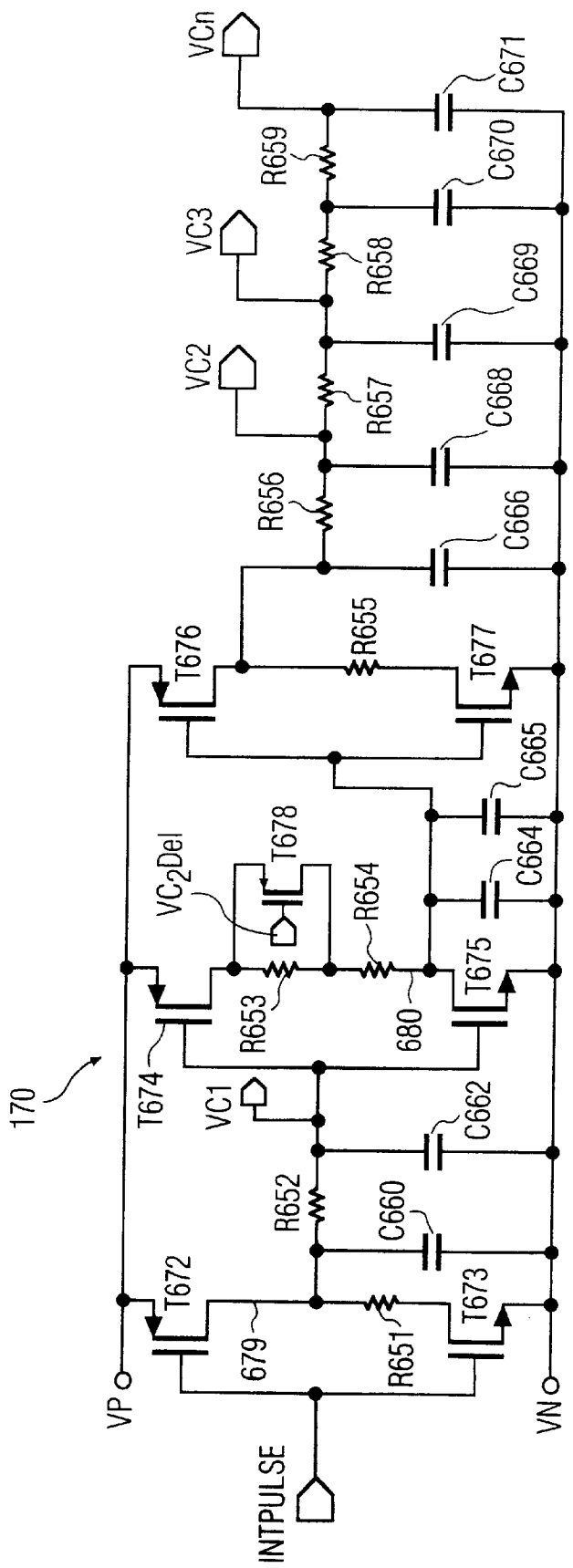
FIG. 5 is circuit diagram of an exemplary circuit 170 for generating the control voltages for the LPF 135.

The MOS switches in LPF 135 have to be switched very slowly, in order to minimize transients. FIG. 5 shows one possible implementation of a circuit 170 which generates the control voltages VC1–VCn to drive the gate of the MOS switches in LPF 135, to achieve the time-dependent movement of the pole of the LPF 135 from the initial relatively high frequency F1 to the lower frequency F2. In this example, an R-C ladder structure is used to generate the control voltages in response to a READ control signal received at the input RdDEL. The outputs of the circuit 170 are the control voltages VC1, VC2, VC3 and VCn which control the MOS switches of the variable capacitor circuit of LPF 135 (FIG. 4B).

The READ control signal received at input RdDEL drives the gates of a PMOS switch T672 and an NMOS switch T673, which together define a switchable current path 679 between supply rails VP, VN through a resistor R651. The current path 679 is coupled to drive the gates of a second pair of PMOS, NMOS transistors T674, T675 via resistor R652. The capacitor C660 and the resistor R651, and the capacitor C662 and the resistor 652 define a first RC time constant. The transistors T674, T675 have main current paths which define a second switchable current path 680 between rails VP, VN through serially coupled resistors R653, R654. The current path 680 is coupled to drive the gates of a third pair of PMOS, NMOS transistors T676, T677 which together similarly define a third switchable current path 681 through a resistor R655. The transistor T678 is coupled around the resistor R653. When a control signal VC2DEL is applied to the gate of the transistor T678 to render it non-conductive, a second RC time constant is defined by the combination of the two resistors R653, R654 and the two capacitors C664, C665. When a control signal VC2DEL is supplied to render the transistor T678 conductive, the resistor R653 is shunted and a fourth time constant is defined by the combination of the resistor R654 and the two capacitors C663, C664 which is shorter than the third time constant. The third and fourth time constants define the time period between when the switches T674, T675 turn on and when the switches T676, T677 turn on. The combination of a fifth time constant defined by the RC pair of a resistor R655 and a capacitor C666 and of a sixth time constant defined by the RC pair of a resistor R656 and a capacitor C668 controls the time period between the turning on of the switches T676, T677 and the generation of the control voltage VC3. Subsequent time constants which define the time lapse between the generation of the control signal VC4 and VC3, and between VCn and VC4 are defined by the further RC pairs R657, C669; R658, C670; and R659, C671.

Figure 6:
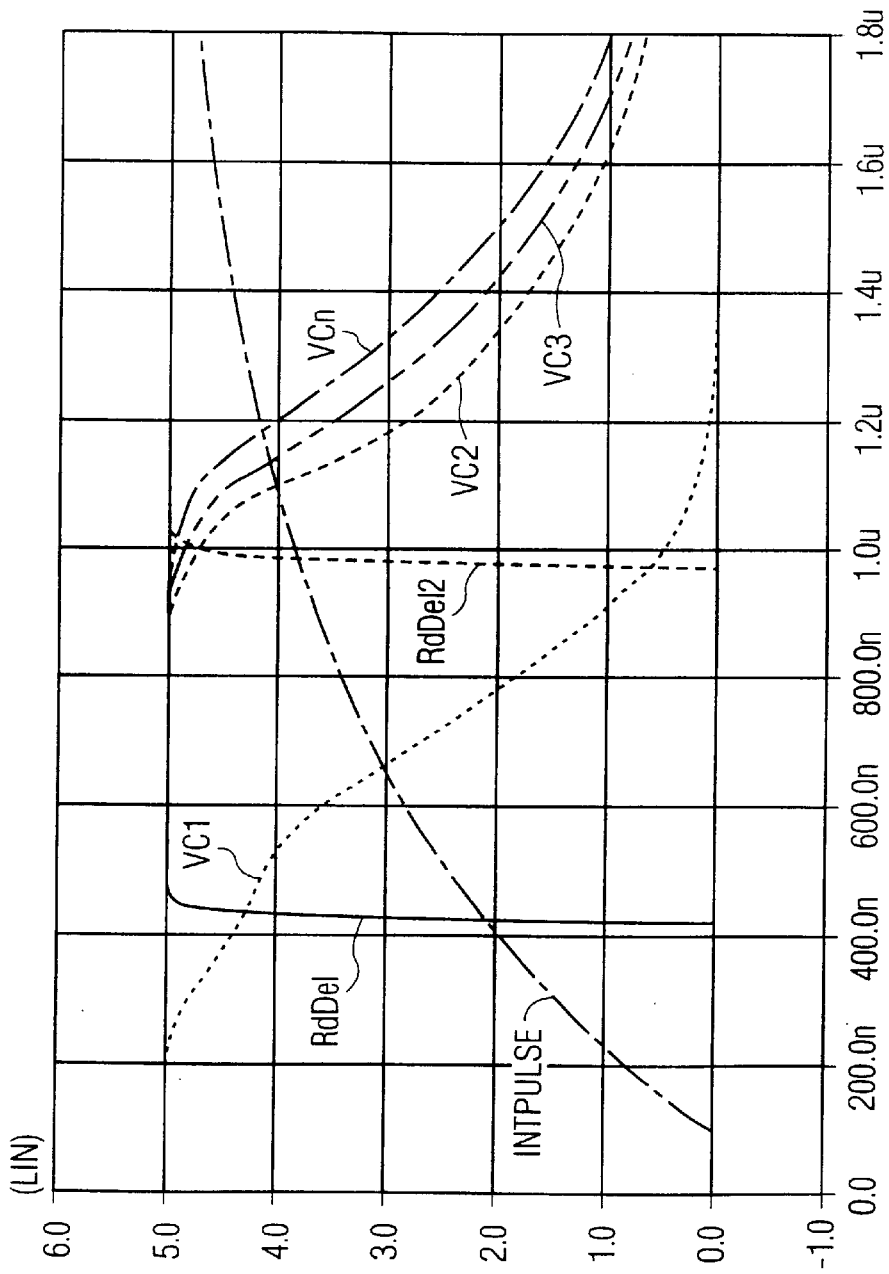
FIG. 6 is a graph illustrating the time-dependent qualities of the control signals for the LPF 135.

The circuit 170 operates as follows. As illustrated in FIG. 6, when the input RdDEL transitions from a logic low to a logic high (corresponding to a write-to-read transition), the switch T672 turns off and the switch T673 begins to turn on when RdDel reaches the threshold voltage of switch T673, about 0.7 V. This couples the lower supply rail VN to generate the control signal VC2 controlled by the RC time constant of the resistors R651, R652 and capacitors C660 and C662. The signal VC1, as shown in FIG. 6 is initially high, due to the previous state of the signal RdDel being logic low. As this signal VC decreases, the NMOS switch T675 turns off and the PMOS switch T674 turns on. This couples the gates of the further switches T676, T677 to the supply rail VP, which turns on the switch T677 and turns off the switch T676. When switch T677 turns on, the outputs VC2, VC3 through VCn are coupled to the rail VN, generating the control voltages VC2, VC3, VCn at these outputs with time delays based on the intervening time constants between the respective delay and the switch T677. The switch T678 serves as an adjustment switch to optionally change the time constants between the control signals VC1 and VC2, by switching creating a shunt around the resistor R653 with the control signal VC2del.

The control input signals INTPULSE, Rddel, and Rddel2 and control voltages VC1 to VC4 generated by circuit 170 and driving the MOS switches in LPF 35 would typically appear as shown in FIG. 6. The slow switching signals for the MOS switches of the variable capacitor of FIG. 4B can be generated in several other ways, which could be easily implemented by those of ordinary skill in the art in view of the example of FIG. 5 and the waveforms of FIG. 6.

Figure 7:
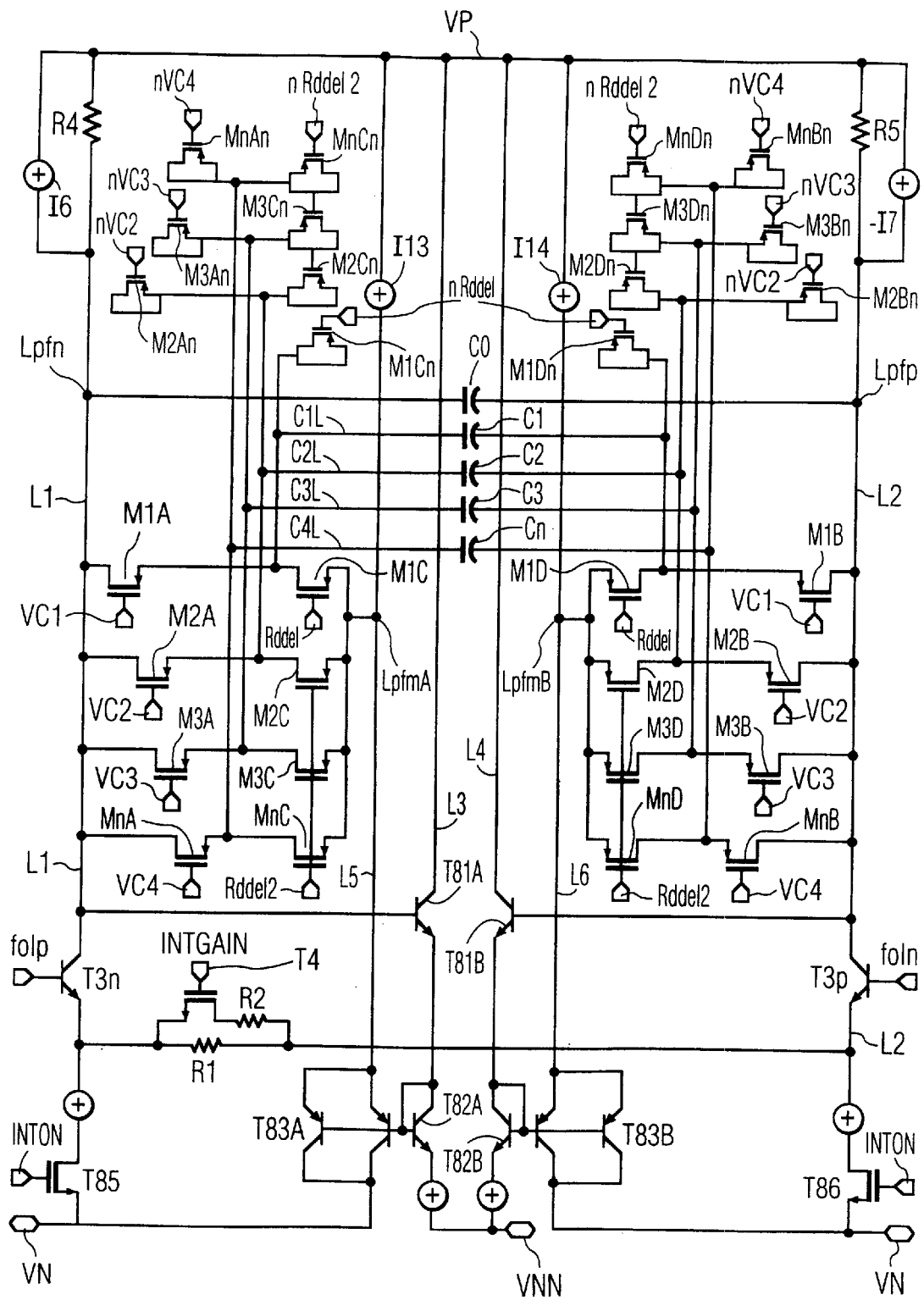
FIG. 7 is a circuit diagram illustrating a second embodiment to provide a variable capacitance with low switching transients of the LPF 135.

FIG. 7 is an alternative embodiment of the variable capacitance circuit within LPF 135. A key requirement of a preamplifier circuit with respect to entering the steady read mode is the absence of DC transients above 20 mV. In other words, the steady read mode is defined as beginning upon the last occurrence of a differential DC transient above this level. Accordingly, it is important that the switching of the capacitors in the LPF not induce differential DC transients. The present inventors recognized that this could occur if the voltage on each node of a capacitor C2–Cn in LPF 135 were different when that capacitor was switched into the circuit, as different voltages would cause the capacitor to discharge, rapidly creating transient currents. Additionally, it is important that prior to the initiation of the read mode the capacitances are not reflected to the nodes Lpfn, Lpfp, so that the pole of filter 135 starts at a high frequency prior to the capacitors C1–Cn being switched into the circuit.

FIG. 7 shows capacitors C0–Cn and PMOS switches M1A–M1n, M1B–M1n corresponding to FIG. 4B. Additionally, FIG. 7 shows circuitry which equalizes the voltage on the nodes on either side of the capacitors C1–Cn prior to the capacitor being switched into the circuit. A transistor T81A is coupled in the branch L3 and has its emitter coupled to the collector of a diode connected transistor T82A. The base of the transistor T81A is coupled to branch L1, and is at the same potential as node Lpfn. Thus, the base of the transistor T82A is one diode drop below node Lpfn. Transistor T83A has its base coupled to the base of the transistor T82A and its emitter coupled to the rail VP via a current source I3. The node LpfmA, between the current source I3 and the emitter of the transistor T83A is one diode drop above the base of transistor T82A, so is at the same voltage as node Lpfn. The difference in base-emitter voltages due to different currents and mismatches in transistors is accounted for by appropriate dimensioning of the transistors T82A, T83A to achieve voltage equivalence between nodes Lpfn and LpfmA. The transistors T81B, T82B, T83B are coupled in a corresponding manner to the circuit branches L2, L4, L6, so that the node LpfmB is at the same potential as node Lpfp in branch L2. The control gate of PMOS equalization transistors M1C, M1D are coupled to the input RdDel and the control gate of PMOS transistors M1A, M1B are coupled to receive control voltage VC1 of FIG. 5. Similarly, the gates of PMOS equalization transistors M2C,M2D; M3C; M3D and MnC; MnD are coupled to receive the signal Rddel2 and the gates of the PMOS transistors M2A,M2B; M3A, M3B and MnA,MnB receive the control voltages VC2, VC3, VCn.

With reference to FIG. 6, the signal VC1 is initially high and the signals RdDel and Rddel2 are initially low. Thus, the equalization switches M1C-MnC and M1D-MnD are initially conductive and couple each of the capacitors C1–Cn to the nodes LPFmA, Lpfmb. Both nodes are coupled to the same DC potential thereby. Furthermore, because the nodes LpfmA, LpfmB are coupled to the nodes Lpfn, Lpfp through two emitter followers (formed by the transistors T81A, T82A; T82A, T82B) the capacitance of devices C1–Cn is reduced by a factor of $\beta^2$ and are substantially not reflected to the nodes Lpfn, Lpfp, so that the cut-off frequency of filter 135 is primarily determined by the capacitance of device C0. When Rddel goes high, switches M1C and M1D turn off, as signal VC1 goes low and switches M1A, M1B turn on to bring capacitor C1 into circuit. When signal VC1 turns switch M1A, M1B on, both sides of the capacitor C1 will have been at the same potential, so DC switching transients are minimized. Note that devices C2–Cn are still decoupled from the filter in the AC sense by equalization switches M2C–MnC; M2D, Mnd and their corresponding emitter-followers so that their capacitance does not influence the relatively high pole determined by capacitance C. Signal Rddel2 then goes logic high, turning equalization switches M2C–MnC off, and signals VC2–VCn then go logic low is succession to further reduce the pole frequency of LPF 135.

Switches M1C–MnC and M1D–MnD introduce gate-source and gate-drain capacitances into the LPF 135, and thus may introduce their own current transients upon switching. To counteract this problem, a number of compensating PMOS transistors (M2An–MnAn; M1Cn–MnCn; M2Bn–MnBn; M1Dn–MnDn) are provided corresponding to respective ones of the PMOS switches M2A–MnA; M1C–MnC; M2B–MnB; M1D–MnD. The compensating PMOS transistors have their drains coupled to their sources, effectively doubling their capacitive effect and allowing these compensating devices to be substantially reduced in size. Since the source and drains are connected to each other, these PMOS devices do not function as switches, but as capacitors. The compensating PMOS devices are provided with a charging signal at their gates, at the same time their respective equalizing PMOS switches are driven, which charging signal is selected to induce a charge therein of the opposite sense as the charge induced in the respective equalization switch when it is switched. In this manner, the charging signals can be selected to reduce transient currents based on the actual transients induced in the IC by the equalization switches, whereas a fixed compensating capacitor could not. Thus, the compensating CMOS devices minimize transients and ensure that the equalization circuitry doesn't degrade its own performance with respect to reducing the settling time of write-to-read disturbances.

The MOSFET switches T85, T86 receive signal INTON which controls whether the LPF 135 is on or off. The switch T4 receives a control signal INTGAIN, and switches the resistor R2 into and out of circuit with the resistor R1. The resistors R1, R2 determine the DC gain of LPF 135 and signal INTGAIN is used to switch the LPF 135 between a high and a low gain mode. This provides a different gain control mechanism than the variable capacitance circuitry, which varies the pole of the LPF.

II) Optimization of Write-to-Read Settling Time Through a Serial Interface Register.

It is favorable if the programmability of write-to-read settling time in the read channels is programmable. This will enable a user of the preamplifier IC to program the suppression characteristics in each preamplifier IC to fine tune variations in write-to-read disturbances in each hard disk drive, thereby optimizing performance. In one embodiment, programmability is achieved through a serial interface connection with the preamplifier IC. Registers in the serial interface are designated to turn the "knobs" of various control elements in the read channel which control write-to-read suppression.

Figure 8:
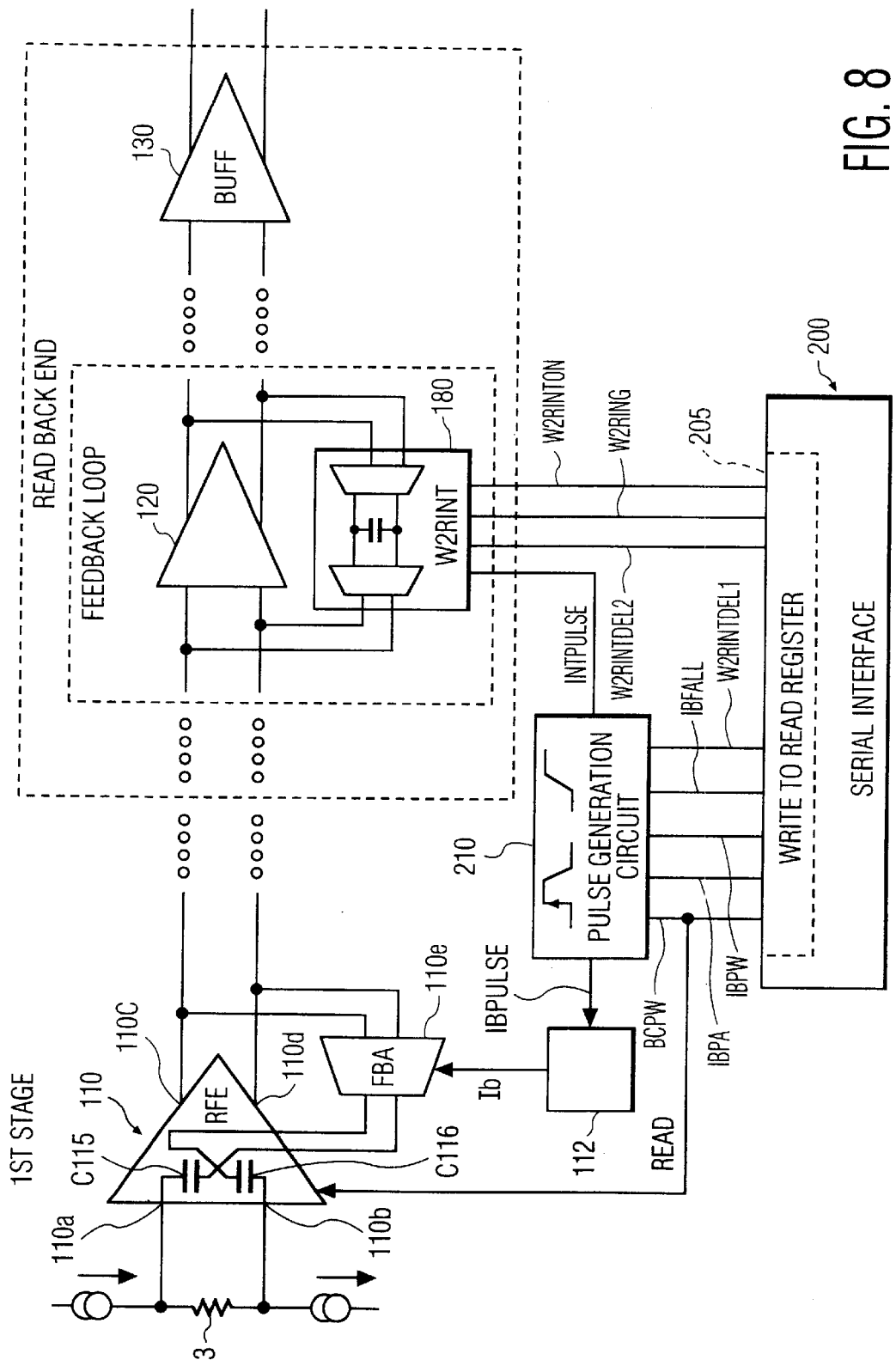
FIG. 8 is a block diagram of a read channel of a magnetic recording/reproducing apparatus having a serial interface for programming write-to-read control circuitry.

FIG. 8 is a block diagram of one embodiment illustrating the programming of a preamplifier IC through a user interface. Elements corresponding to those in previous Figures bear the same reference numbers. In this embodiment, the read channel includes two programmable control elements which control the write-to-read suppression. The first control element is in the first gain stage 110 coupled to a read sensor 3. The second control element is a "back-end" control circuit W2RINT 180 corresponding to the LPF 135 and Gm stage 140 in combination with the control circuit 170 of FIG. 5. Both of these control elements are controlled by the contents of a serial interface register 205 of a serial interface 200. This serial interface register is an eight bit register storing the following variables (in the order of most-significant-bit (MSB) to least-significant-bit (LSB)): BCPW, IBFALL, IBPA, IBPW, W2RINTDEL2, W2RINTDEL1, W2RINTG and W2RINTON.

As shown here, the first gain stage 110 has cross coupled capacitors C115, C116 and a feedback amplifier ("FBA") 110e between the differential outputs 110c, 110d and the cross-coupled capacitors. This first gain stage 110 with cross-coupled capacitors is known, for example, from U.S. Pat. No. 5,559,646 (Voorman et al), incorporated herein by reference. This gain stage 110 also includes a conventional common mode control circuit which controls the common mode DC voltage.

Varying the gain of the feedback amplifier 110e controls the low corner frequency, in other words a zero, of the first stage 110. The feedback amplifier 110e is a transconductance (Gm)stage whose gain is controlled by a biasing current Ib supplied to it from a digital-to-analog converter ("DAC") 112. The current Ib is controlled by a control pulse IBPULSE supplied to DAC 112 by a pulse generation circuit 210. It is noted that it is known in the art to vary the current Ib to change the corner frequency of the first stage between two frequencies and to control the timing of the switchover with a controlled pulse signal. These function are present in Philips Semiconductors' TDA 5360 preamp circuit. However, the changeover is controlled internally, and no programmability through a user interface is available.

Figure 9:
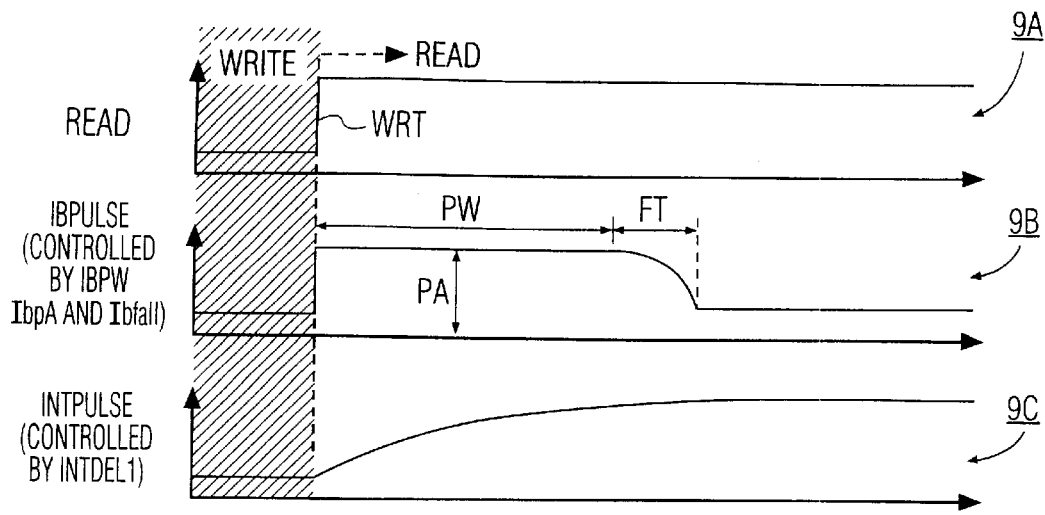
FIG. 9 illustrates the different amplitude, width and slope of pulses controlling the feedback transconductor of the first stage by different settings of IbpA, IbpW and W2RINTDEL1 of the register 205.

The write-to-read circuit senses the onset of the write-to-read transition ("WRT") moment, which is graphically illustrated in chart 9A of FIG. 9. (The write-to-read transition is known from a control signal in the magnetic storage apparatus which controls when the apparatus switches from the write mode to the read mode). The control pulse IBPULSE, illustrated in chart 9B, is supplied by the pulse generation circuit 210. Three of the eight register bits control this bias current. The register bit IBPW is used to control the pulse width "PW". (Chart 9B) The pulse width determines the duration of write-to-read suppression of the feedback amplifier 110e. The register bit IBPA controls the amplitude "PA" of the control pulse, which determines the amplitude of the bias current Ib, which in turn controls the location of the LCF of the gain stage 110 during write-to-read transition. The register bit IBFALL controls the fall time "FT" (slope) of the pulse IBPULSE to ensure a smooth transition so as not create an extra disturbance in the read channel. Depending on the register setting of IBPW, it generates a pulse width PW approximately 150 ns to 300 ns long. The register bit BCPW controls the common mode control circuit within stage 110 to further reduce DC transients at the write-to-read transition.

Under normal operation, the maximum low corner frequency (LCF) of the first stage 110 is programmed to be 2 MHz to 5 MHz. The LCF of the preamplifier IC is determined by the gain of the feedback transconductor in the first stage. During a write-to-read transition, the LCF is shifted to a higher frequency to filter out the write-to-read transient. Depending on the register setting of IBPA, this higher frequency of the LCF of the first stage 110 can be 6MHz to 10 MHz. After the write-to-read transient dies away, the LCF is shifted back to its lower programmed value so it will not adversely affect reading of the data signal.

The back-end control circuit 180 is controlled by the register bits W2RINTDEL1, W2RINTON, W2RING, and W2RINTDEL2. Pulse generation circuit 210 generates a second pulse INTPULSE (Chart 9C) which is fed to W2RINT 180. Register bit W2RINTDEL1 controls the duration that the LCF of circuit 180 is at the first, relatively high frequency. Register bit W2RINTDEL1 directly controls the delay time of INTPULSE (from the READ signal to reaching the logic threshold on INTPULSE. INTPULSE is input to control circuit 170 (FIG. 5) and therefore controls the delay between the write-to-read transition and the activation of switches TT672, T673. Register bit W2RINTON turns circuit 180 on and off, via the switches T85, T86 (FIG. 7) Register-bit W2RINTG controls the gain of the LPF 135, via switch T4. Register bit W2RINTDEL2 is provided to the input VC2Del, and thus controls the duration of change of the LCF from the first, relatively high frequency to the second, relatively low frequency. By way of example, the first relatively high frequency may be 15 MHz, the second lower frequency may be 150 KHz. Thus, to suppress write-to-read transients, the LCF is initially at 15 MHZ to suppress the high initial peak illustrated in FIG. 2A. The LCF is moved to 150 Khz gradually to suppress the long tail without over filtering, and is then maintained at 150 KHz. This very low LCF is to ensure that the existence of the feedback circuit 180 does not have a significant impact on the overall frequency response of the read channel.

Figure 10:
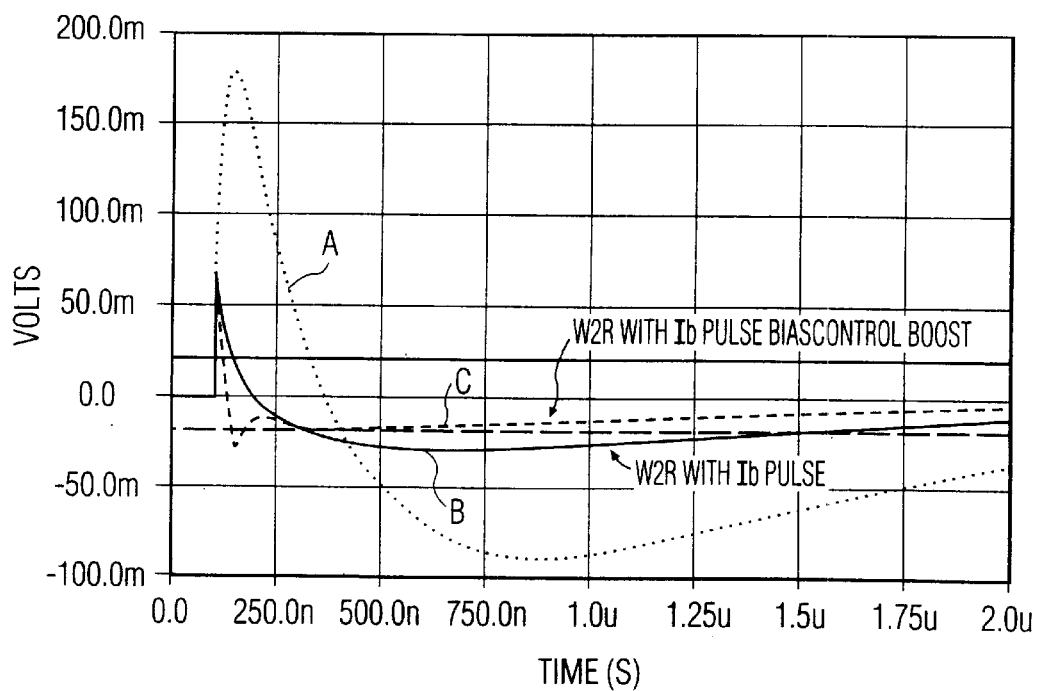
FIG. 10 illustrates the effect of the first stage FBA on a write-to-read disturbance.

FIG. 10 is a graph which illustrates the effect of the first stage 110 in reducing the write-to-read transition. Line "A" is an uncorrected write-to-read disturbance. Line "B" is the write-to-read disturbance with only the FBA 110e activated to reduce the disturbance. Line "C" shows the additional reduction provided by by a boost in the gain of the common mode control circuit within stage 110 to reduce DC transients at this first stage.

Figure 11:
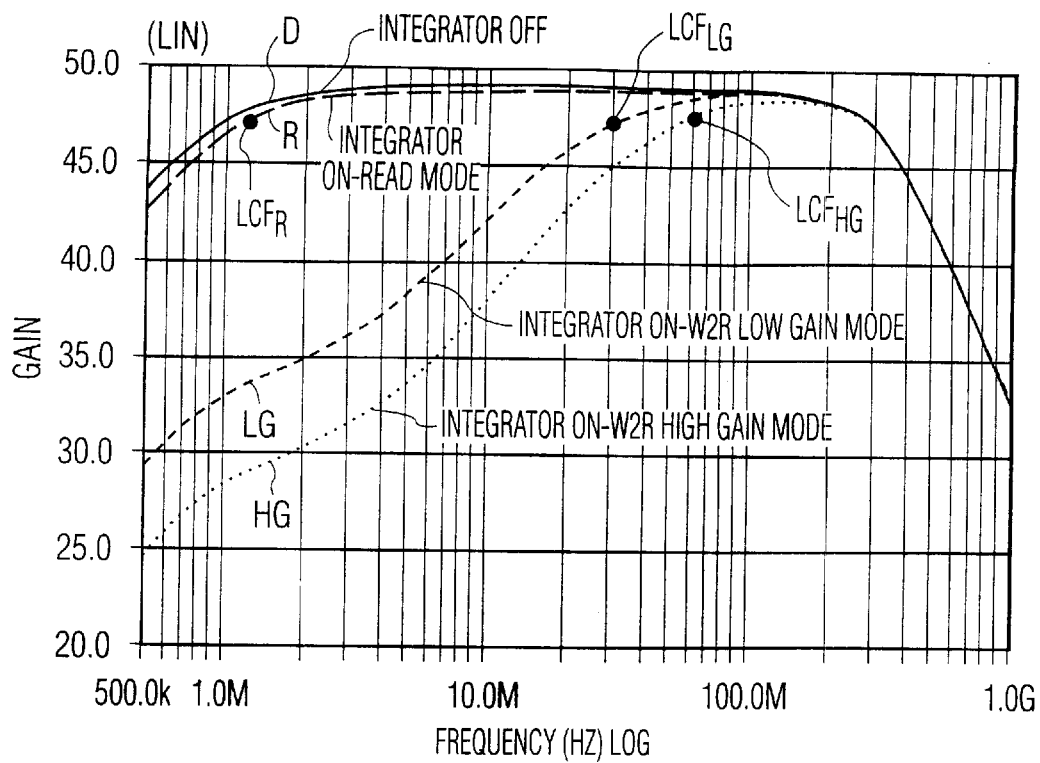
FIG. 11 shows the frequency response of the read channel with the feedback loop of LPF 135 and Gm stage 140, illustrating the shifting of the LCF from a high frequency to filter switching disturbances to a lower frequency for the settled read mode.

FIG. 11 illustrates the frequency response of the entire read channel 100 with the feedback integrator (stages 135, 140) in different gain modes. Line HG represents the high gain mode of the feedback integrator, which would occur if the W2RINTG bit is set to high. The LCF of the system, $LCF_{HG}$, in the high gain mode is dominated by the feedback integrator and is at a high frequency to filter the peak portion of the write-to-read disturbance. Line LG represents the integrator is set in a lower gain mode, when the W2RINTG bit is set to logic-low. Line R represents the steady state of the read path frequency response during the read mode. Line O is the frequency response of the read channel when the feedback integrator is turned off. As is quite evident, during the normal read mode, the integrator has little effect on the frequency response of the read channel. This is because the zero introduced by the W2RINT 180 when the read channel is nominally operating is sufficiently lower than (approx 10 times lower freq.) than the zero of the first stage 110 of the preamplifier that the zero (i.e. the low corner frequency) of the overall read channel is not affected by the zero in the W2RINT 180. However, as demonstrated earlier, the integrator nonetheless significantly reduces the offset of the preamplifier IC.

Figure 12:
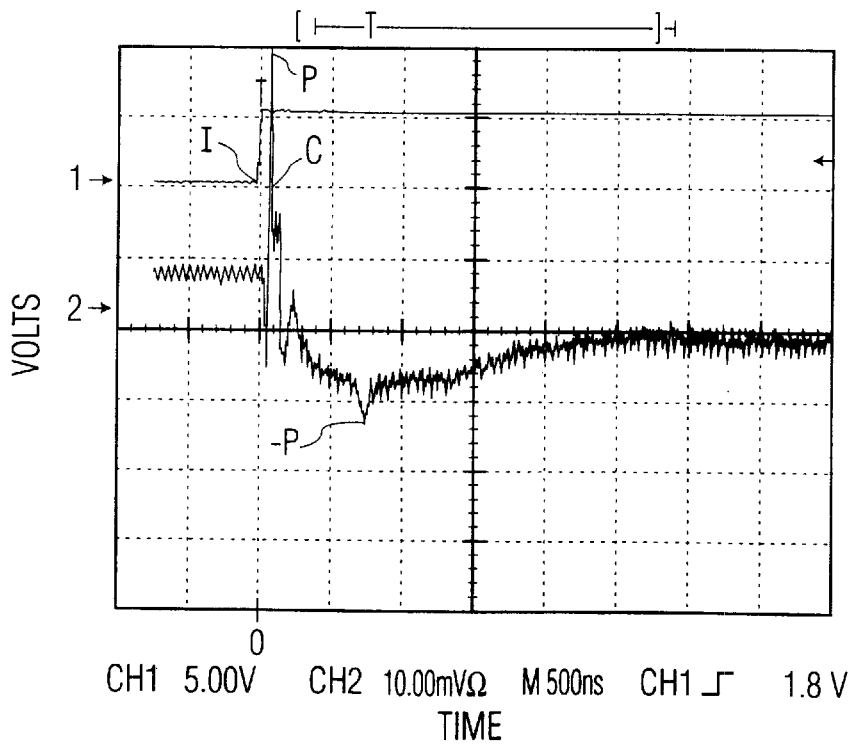
FIG. 12 is a graph illustrating the significant reduction of write-to-read settling time with the preamplifier IC according to the invention.

FIG. 12 illustrates an actual write-to-read disturbance after filtering with a preamplifier IC having both of the first and second control elements. The write-to-read transition is at moment "I" in the FIG. The disturbance has a high initial peak "P", of a negative peak "–P", and a tail. As mentioned previously, the beginning of the settled read mode is defined as beginning at the last occurrence where the disturbance has a magnitude of 20 mV. In FIG. 12, this occurs at a time of 124 ns, at point "C". In circuits without the filtering elements of the present invention, settling time was typically on the order of 4 to 10 microseconds. Thus, the present invention provides an improvement in settling time averaging on the order of a factor of 50.

With this "write-to-read" register, disk drive manufacturers can optimize the write-to-read performance easily by programming through the serial register. This also shortens the design cycle because different parameters can be tested without the need of changing the design of the read channel.

The process or technology by which the of the invention is made is not important and any of the standard bipolar, CMOS or BiCMOS processes can be used.

Although preferred embodiments of the present invention have been shown and described, it will be appreciated by those skilled in the art that changes may be made in these embodiments without departing from the principles and spirit of the invention, the scope of which is defined in the claims.

The many features and advantages of the invention are apparent from the detailed specification and it is intended by the appended claims to cover all such features and advantages which fall within the true spirit and scope of the invention. Since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A magnetic information storage apparatus, comprising:
    a write channel for writing information to a magnetic medium; and
    a read channel for reading information from the magnetic medium, said read channel including
        a sensor for generating an information signal in response to information stored on the magnetic medium;
        an output; and
        a signal path coupled between the sensor and the output which amplifies the information signal from the sensor and provides the amplified information signal to the output, when transitioning from a write mode in which the write channel is active to a read mode in which the read channel is active, the transition inducing a write-to-read disturbance in read channel, and the signal path including a filter having a zero which varies from a first frequency to a second, lower frequency in a time-dependent manner related to a time duration of the write-to-read disturbance.

2. An apparatus according to claim 1, wherein said signal path includes a forward signal path including at least one gain stage having an input and an output, and a feedback signal path coupling said output to said input of said at least one gain stage, said feedback signal path including (i) a low pass filter having a pole which varies in a time dependent manner from a third frequency to a fourth lower frequency, thereby generating said time dependent zero in said forward path.

3. An apparatus according to claim 2, wherein said low pass filter includes a variable capacitance, the variation of the capacitance moving the pole of the low pass filter.

4. An apparatus according to claim 3, further comprising a controller which controls the variable capacitance.

5. An apparatus according to claim 4, wherein said controller is programmable for varying the time-wise frequency dependence of the low pass filter.

6. An apparatus according to claim 5, further comprising a serial interface coupled to said controller which allows user input of variables to program said controller.

7. An apparatus according to claim 2, wherein said signal path includes a first gain stage coupled to said sensor, an output buffer, and a plurality of gain stages cascaded between said first stage and said output buffer, and said at least one gain stage is comprised by one of said plurality of gain stages other than said first stage.

8. An apparatus according to claim 7, wherein said at least one gain stage is situated within said plurality of stages closer to said output buffer than said first stage.

9. In integrated circuit for use in a magnetic storage device having a magnetic medium, a write head which writes information to the magnetic medium and a read sensor which reads information from the magnetic medium and generates an information signal, said integrated circuit comprising:

a signal path that receives the information signal and amplifies the information signal to provide an amplified information signal at an output, the signal path including a filter with a zero which varies from a first frequency to a second, lower frequency in a time-dependent manner.

10. An integrated circuit according to claim 9, wherein said signal path includes a forward signal path including at least one gain stage having an input and an output, and a feedback signal path coupling said output to said input of said at least one gain stage, said feedback signal path including (i) a low pass filter having a pole which varies in a time dependent manner from a third frequency to a fourth lower frequency, thereby generating said time dependent zero in said forward path.

11. An integrated circuit according to claim 10, wherein said low pass filter includes a variable capacitance, the variation of the capacitance moving the pole of the low pass filter.

12. An integrated circuit according to claim 11, further comprising a controller which controls the variable capacitance.

13. An integrated circuit according to claim 12, wherein said controller is programmable for varying the time-wise frequency dependence of the low pass filter.

14. An integrated circuit according to claim 13, further comprising a serial interface coupled to said controller which allows user input of variables to program said controller.

15. An integrated circuit according to claim 10, wherein said signal path includes a first gain stage coupled to said sensor, an output buffer, and a plurality of gain stages cascaded between said first stage and said output buffer, and said at least one gain stage is comprised by one of said plurality of gain stages other than said first stage.

16. An integrated according to claim 15, wherein said at least one gain stage is situated within said plurality of stages closer to said output buffer than said first stage.

17. An integrated circuit, comprising:

an input which receives an input signal;

a signal path coupled to said input and including (i) a forward signal path with at least one unity gain stage having a stage input and a stage output and (ii) a feedback path comprising a low pass filter coupled between said stage input and said stage output, said low pass filter having a pole which varies with time, variation of the pole varying the location of a zero in a forward signal path.

18. An integrated circuit according to claim 17, wherein the pole of the low pass filter varies such that the zero in the forward signal path moves from a first frequency to a second, lower frequency.

19. A method of filtering recurring transient disturbances in a signal in a signal path, the disturbances having a magnitude with an initial peak and a tail in which the magnitude decays from the peak, said method comprising:

filtering the signal with a low pass filter in a feedback path coupled to the signal path, the low pass filter having a controllable corner frequency; and recurrently (i) at the initiation point of the transient disturbance, setting the corner frequency of the low pass filter at a first frequency to substantially filter the peak of the disturbance, and (ii) reducing the attenuation of the filter in a time dependent manner related to the decay of the disturbance from the first frequency to a second, lower frequency.

20. A method according to claim 19, wherein the disturbance is triggered by an event in a device, said method further comprising sensing the event to set the filter at the first attenuation level.

21. A method according to claim 19, where the signal path is in a magnetic storage device, and the disturbance is a disturbance induced by a write-to-read transition of the device.

22. An integrated circuit, comprising:

a signal path transmitting a signal subject to recurring transient disturbances, the disturbances having a recurring initiation point, and a substantially consistent peak and decay characteristic;

filtering means for filtering the recurrent transient disturbances, said filtering means comprising a low pass filter in a feedback path coupled to said signal path, said low pass filter having a controllable corner frequency; and control means coupled to said filter means for recurrently varying the corner frequency of said low pass filter to provide relatively high filtering when the disturbance has a high magnitude and relatively low filtering when the disturbance has a low magnitude.

23. An integrated circuit according to claim 22, wherein the disturbance has an initial peak occurring adjacent the initiation point and a long tail substantially longer than the duration of the peak in which the disturbance decays towards a minimum value, and said control means at the initiation point sets the low corner frequency at a first frequency for a duration of the peak and moves the low corner frequency to a lower frequency in a step-wise manner related to the decay of the tail.

24. An integrated circuit according to claim 22, wherein the low corner frequency is programmable.

* * * * *

Disclaimer 6,404,578—Sanjay M. Bhandari, Santa Clara; David Allouche, Belmont, both of CA (US). CIRCUIT FOR REDUCTION AND OPTIMIZATION OF WRITE-TO-READ SETTLING TIME IN MAGNETIC MEDIUM STORAGE DEVICES. Patent dated June 11, 2002. Disclaimer filed June 24, 2008, by the assignee, Koninklijke Philips Electronics N.V.

Hereby disclaims all of the claims of said patent.

(*Official Gazette September 30, 2008*)